United States Patent
Wolski et al.

[11] Patent Number: 5,834,140
[45] Date of Patent: Nov. 10, 1998

[54] ELECTRODEPOSITED COPPER FOIL FOR FINE PATTERN AND METHOD FOR PRODUCING THE SAME

[75] Inventors: Adam M. Wolski, Edgewater Park, N.J.; Michel Streel, Houffalize, Belgium; Akitoshi Suzuki; Hideo Otsuka, both of Imaichi, Japan

[73] Assignee: Circuit Foil Japan Co., Ltd., Tokyo, Japan

[21] Appl. No.: 715,104

[22] Filed: Sep. 18, 1996

[30] Foreign Application Priority Data

Sep. 22, 1995 [JP] Japan .................................. 7-244262
Apr. 26, 1996 [JP] Japan .................................. 8-106743

[51] Int. Cl.$^6$ ........................................................ C25D 1/04
[52] U.S. Cl. ............................. 429/220; 205/57; 205/77; 205/296; 428/606; 428/607; 428/612; 428/675; 428/687; 428/935; 429/122; 429/245
[58] Field of Search .................................. 205/50, 76, 77, 205/57, 296; 428/606, 607, 612, 675, 687, 935; 429/122, 220, 245

[56] References Cited

U.S. PATENT DOCUMENTS

| | | | |
|---|---|---|---|
| 4,975,159 | 12/1990 | Dahms | 205/125 |
| 5,171,417 | 12/1992 | DiFranco et al. | 205/77 |
| 5,215,645 | 6/1993 | DiFranco et al. | 205/77 |
| 5,403,465 | 4/1995 | Apperson et al. | 205/77 |
| 5,421,985 | 6/1995 | Clouser et al. | 205/77 |
| 5,431,803 | 7/1995 | DiFranco et al. | 205/50 |
| 5,433,840 | 7/1995 | Dahms et al. | 205/296 |
| 5,454,926 | 10/1995 | Clouser et al. | 205/50 |
| 5,534,129 | 7/1996 | Hoffacker et al. | 205/241 |

FOREIGN PATENT DOCUMENTS 41 26 502   2/1993   Germany .

*Primary Examiner*—Kathryn L. Gorgos
*Assistant Examiner*—William T. Leader
*Attorney, Agent, or Firm*—Frishauf. Holtz, Goodman, Langer & Chick, P.C.

[57] ABSTRACT

The present invention is an electrodeposited copper foil characterised in that roughening treatment is performed on a matte side of an untreated copper foil wherein the surface roughness $R_z$ of the matte side of the untreated copper foil is the same as or less than the surface roughness $R_z$ of the shiny side of this untreated copper foil. The electrodeposited copper foil is made by electrodepositing copper onto a drum from an electrolyte which contains 0.05 to 5 ppm 3-mercapto 1-propanesulfonate; at least one organic compound selected from 0.1 to 15 ppm of a polysaccharide which is a carbohydrate such as starches, celluloses and vegetable rubbers, and 0.3 to 35 ppm of a low molecular weight glue having a weight average molecular weight of 10,000 or less; and 10 to 60 ppm of a chloride ion. The copper foil may be used in making a printed circuit board or as a component of a secondary battery cell.

15 Claims, 1 Drawing Sheet

5,834,140

ELECTRODEPOSITED COPPER FOIL FOR FINE PATTERN AND METHOD FOR PRODUCING THE SAME

BACKGROUND OF THE INVENTION

1. Field of the Invention

The present invention relates to an electrodeposited copper foil which is capable of making a fine pattern and capable of obtaining a high etching factor, a method for producing the same, and a copper-clad laminated board and a printed-wiring board (printed circuit) using the same.

Also, the untreated copper foil according to the present invention has flatter surfaces on both surfaces as compared with the conventional ones so that it can be used as an electrode material for a secondary battery, a flat cable, a shielding material for covering cables and others, but use of the electrodeposited copper foil of the present invention is not limited thereto.

2. Prior Art

An electrodeposited copper foil for a printed circuit has been produced industrially by filling a gap between an insoluble electrode such as a lead electrode or a titanium electrode covered with a platinum group metal and a rotating cathode drum which is made of stainless steel or titanium and opposed to the insoluble electrode, with an electrolyte of a copper sulfate aqueous solution, passing electricity to these electrodes to electrodeposit copper on the rotating cathode drum and peeling off the electrodeposited copper continuously.

In general, when an aqueous solution containing only a copper ion and a sulfuric acid ion is used as an electrolyte, pinhole or microporosity is generated on the copper foil due to dust or oils inevitably existing in the equipments and causes serious problems in practical use. Also, the mountain-valley shape of a surface (a matte side) of the copper foil which contacts with the electrolyte is deformed so that sufficient strength cannot be obtained when the copper foil is adhered to an insulating substrate material in a later stage. When roughness of the matte side is large, there are caused problems that insulation resistance between layers and circuit conductivity of a multilayer printed-wiring board (printed circuit) are lowered, or at pattern etching after adhering the copper foil to a substrate material, transfer of copper to the substrate or undercutting of a circuit portion occurs, whereby various characteristics as a circuit substrate are damaged.

In order to prevent the pinhole or the like, a chloride ion is added to the electrolyte, or the electrolyte is passed through a filter containing activated carbon to remove dust and oils. In order to prevent microporosity and adjust the mountain-valley shape of the matte side, glue has heretofore been added to the electrolyte, and it has been also proposed to add various organic materials and inorganic materials as additives other than glue. Technology of producing an electrodeposited copper foil for a printed-wiring board is based on plating technology as can be understood from the point that electrodes are provided in a solution containing a metal salt and electricity is passed to the electrodes to electrodeposit a metal on a cathode. As an additive for producing the electrodeposited copper foil for a printed-wiring board, an additive for copper plating can be diverted in many cases. Glue, thiourea and molasses have heretofore been known as a brightener for copper plating, and when the above additives are added to the electrolyte, it can be expected to exhibit a so-called brightening effect, i.e., an effect of making roughness of the matte side smaller with respect to the electrodeposited copper foil for a printed-wiring board. In U.S. Pat. No. 5,171,417, there has been disclosed a method of producing an electrodeposited copper foil, in which activated sulfur such as thiourea is used as an additive. However, the electrodeposited copper foil for a printed-wiring board is produced with current density which is higher than that of common plating in order to improve productivity, etc.; in recent years, characteristics required for the electrodeposited copper foil for a printed-wiring board have been heightened significantly; and in particular, there has been demanded strongly a copper foil in which roughness of the matte side is suppressed without impairing mechanical characteristics such as elongation, whereby satisfactory characteristics cannot be obtained under the present circumstances even when the above additives for plating are used as such as additives for the electrodeposited copper foil for a printed-wiring board.

On the other hand, in recent years, developments in electronic circuit technology including a semiconductor and an integrated circuit are remarkable. As a matter of course, further technological innovation has been demanded even in a printed-wiring board which is a forming portion or a mounting portion thereof. These demands are to develop a highly multilayered and finely patterned printed circuit board.

Characteristics required for the electrodeposited copper foil for a printed-wiring board in order to satisfy these demands are good insulation property between layers and patterns, low profiling of a matte side (lowering in roughness) in order to prevent undercutting at etching, improved high temperature elongation characteristic in order to prevent crack due to thermal stress and also high tensile strength for dimensional stability of the printed-wiring board. A demand for further low profiling for fine patterning has been particularly strong.

Low profiling of the matte side can be accomplished by, for example, adding a large amount of glue or thiourea to the electrolyte as described above, but accompanied with increase in its amount added, both of ordinary temperature elongation and high temperature elongation are lowered abruptly. On the other hand, a copper foil obtained from an electrolyte to which no additive is added has extremely high values of ordinary temperature elongation and high temperature elongation, but the shape of the matte side is deformed, roughness is enlarged, high tensile strength cannot be maintained, and further it is impossible to produce an electrodeposited copper foil in which these characteristics are stable. When electrolysis current density is suppressed to a lower value, as compared with an electrodeposited foil prepared with high current density, roughness of the matte side is lowered and elongation and tensile strength are improved, but lowering in productivity is not preferred from an economical view.

As described above, it is not easy to realize further low profiling, good room temperature elongation, good high temperature elongation and high tensile strength which have been demanded for a recent electrodeposited copper foil for a printed-wiring board.

As the reason why fine pattern cannot be produced by the conventional electrodeposited copper foil, there may be mentioned that a surface roughness of the foil is rough.

An electrodeposited copper foil can be generally produced by firstly using an electroforming cell as shown in FIG. 1 to produce a copper foil which is called to as an untreated copper foil and then using a treater as shown in FIG. 2, the produced copper foil is subjected to bond enhancing treatment and stain proofing treatment to prepare a surface treated copper foil.

In the electroforming cell, an electrolyte 3 is passed through an apparatus comprising a drum-shaped cathode 2 (the surface of which is made of SUS (stainless steel) or titanium) which is rotating and an anode 1 (a lead electrode or a titanium electrode covered by a noble metal oxide) provided to a concentric circle shape to said cathode 2, and an electric current is passed through both electrodes to deposit copper on the surface of said cathode with a desired thickness and then the copper foil is peeled off from the surface of said cathode. The thus prepared foil is called to as an untreated copper foil.

Thereafter, in order to provide characteristics necessary for a copper-clad laminated board, the untreated copper foil 4 is passed through the treater as shown in FIG. 2 to carry out an electrochemical or chemical surface treatment continuously. Among these treatments, there is a process of depositing copper modules on the surface of the foil for enhancing bonding strength of the foil when it is laminated to an insulating resin substrate. This process is called to as a bond enhancing treatment. The copper foil subjected to the above treatments is called a treated copper foil 8 and can be used for a copper-clad laminated board.

Mechanical characteristics of the electrodeposited copper foil can be determined by the characteristics of the untreated copper foil 4, and an etching characteristic of a copper foil, i.e. an etching rate and uniform dissolution property are also determined in a large part by the characteristics of the untreated foil.

A main factor which affects an etching characteristic among the characteristics of a copper foil is a surface roughness of the foil. An effect of a roughness of the surface which is subjected to the bond enhancing treatment and to be laminated to an insulating resin substrate is remarkable. Factors which affect the roughness of the copper foil can be roughly divided into two. One of which is a surface roughness of the untreated copper foil and the other is a manner of copper nodules to be deposited to the surface subjected to the bond enhancing treatment of the foil. When the surface roughness of the untreated copper foil which is a raw foil is rough, the roughness of the copper foil after the bond enhancing treatment becomes rough. Also, generally speaking, when a deposited amount of copper nodules to the foil is a large, the roughness of the copper foil after the bond enhancing treatment becomes rough. The deposited amount of copper nodules at the bond enhancing treatment can be controlled by the amount of the electric current to be flown at the time of the treatment while the surface roughness of the untreated copper foil is almost determined by the electrolysis conditions when copper is deposited on the drum-shaped cathode as mentioned above, particularly by an additive to be added to an electrolyte.

In general, in the untreated copper foil, the so-called shiny side which is a surface at the side contacting with the drum has a relatively smooth surface, but at the reverse surface called a matte side, unevenness is relatively remarkable. In order to smooth the matte side, some attempts have been made until now. For example, there is a method for producing an electrodeposited copper foil prepared by using an active sulfur such as thiourea, etc., as an additive as disclosed in the above-mentioned U.S. Pat. No. 5,171,417. However, in this case, while the roughened surface can be smoothened as compared with the case where a conventional additive such as glue is used, it is still rough as compared with the shiny side and the effect is not yet complete.

Also, since the shiny side is relatively smooth so that, as disclosed in Japanese Provisional Patent Publication No. 270331/1994, an attempt has been made that copper nodules are deposited to the shiny side whereby laminating it with a resin substrate. However, in this case, there is a disadvantage that it must adhere a dry film or a resist to the usual matte side whereby adhesive force to the copper foil lowers due to unevenness of the surface and the film or the resist easily peels off from the foil.

SUMMARY OF THE INVENTION

The present invention has been made in order to cancel the problems of the prior art techniques, and an object thereof is to provide a copper foil which has a high etching factor without lowering peeling resistance and acomplishes fine pattern without remaining copper particles at the root of the circuit pattern, and also has a large high temperature elongation and high tensile strength.

Here, the measure of the fine pattern can be generally shown by the etching factor $(=2T/(Wb-Wt))$ shown in FIG. 3. If the value is larger, the shape of the section of a circuit becomes more sharp.

The present invention is an electrodeposited copper foil which comprises a copper foil having a shiny side and a matte side and said matte side which has a surface roughness $R_z$ measured by JIS B 0601-1994 of substantially the same as that of the shiny side or less being subjected to a surface roughening treatment. Surface roughness $R_z$ means $R_z$ as specified by the definition of JIS B 0601-1994 "Indication of definition of surface roughness" 5.1, i.e. 10-point mean roughness ($R_z$).

This untreated copper foil can be obtained by electrolysis using an electrolyte to which has been added a chemical compound having a mercapto group and apart from this at least one type of organic compound and chloride ions.

DESCRIPTION OF THE PREFERRED EMBODIMENTS

Figure 1:
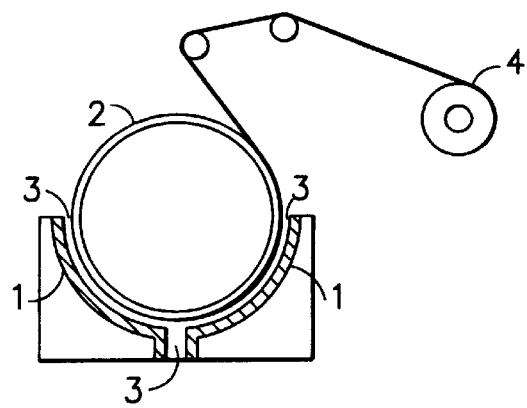
FIG. 1 is a sectional view showing the structure of an electroforming cell wherein the reference numeral 1 is an anode of an electroforming cell, 2 is a cathode of an electroforming cell, 3 is an electrolyte of an electroforming cell and 4 is an untreated copper foil.
Figure 2:
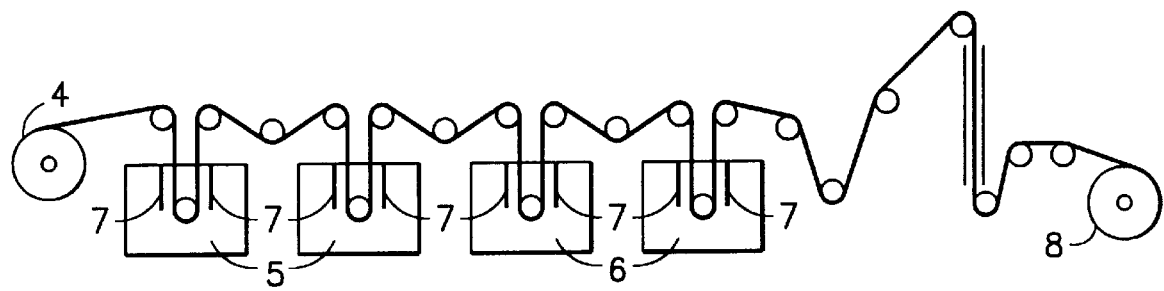
FIG. 2 is a sectional view showing the structure of a treater wherein the reference numeral 4 is the same as in FIG. 1, 5 is an electrolyte of a treater, 6 is an electrolyte of a treater, 7 is an anode of a treater, and 8 is a surface-treated copper foil.
Figure 3:
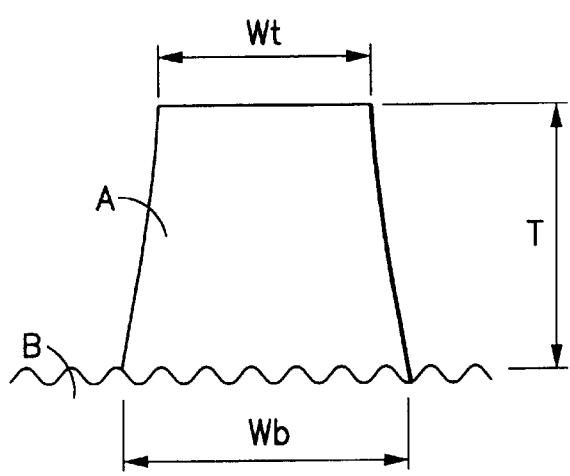
FIG. 3 is a schematic view showing a calculating method of an etching factor wherein A is a cross-section of copper foil, B is an insulating board, Wt is a top width of copper foil cross-section, Wb is a bottom width of copper foil cross-section and T is a thickness of a copper foil.

An electrodeposited copper foil of the present invention comprises an untreated copper foil having a shiny side and a matte side, and a surface roughness $R_z$ of the matte side is the same as a surface roughness $R_z$ of the shiny side or less and the matte side is subjected to a surface bond enhancing treatment. Here, the surface roughness $R_z$ means a ten-point mean roughness ($R_z$) defined at the paragraph 5.1 of "Definition and Designation of Surface Roughness" according to "JIS B 0601-1994".

In the present invention, an additive which is a base of a combination is 3-mercapto 1-propanesulfonate as a compound having a mercapto group. 3-Mercapto 1-propanesulfonate is a compound representatively shown by $HS(CH_2)_3SO_3R$ or the like, wherein R represents an alkali metal atom such as lithium, sodium, potassium, etc. Among these, sodium is particularly preferred as an alkali metal atom. This compound does not have a strong effect of making copper crystal fine when it is used alone. However, by using the compound in combination with other organic compound, copper crystal can be made fine and a plating surface having less unevenness can be obtained. Detailed action and mechanism thereof have not yet been clarified, but it is estimated that a molecule of the compound is reacted with a copper ion in a copper sulfate electrolyte to be converted into a complex, or the compound acts on a plating interface to elevate overvoltage, whereby copper crystal can be made fine and a plating surface having less unevenness can be formed.

One organic compound other than the compound having a mercapto group to be used in combination is a high molecular weight polysaccharide. The high molecular weight polysaccharide is a carbohydrate such as a starch, a cellulose and a vegetable rubber and generally becomes colloid in water. As a polysaccharide produced industrially and inexpensively, there may be mentioned edible starch, starch for industrial use and dextrin as a starch; water-soluble cellulose ether as disclosed in Japanese Provisional Patent Publication No. 182890/1990, i.e., sodium carboxymethyl cellulose and carboxymethylhydroxyethyl cellulose ether as a cellulose; and gum arabic and tragacanth gum as a vegetable rubber.

By using the above organic compound in combination with 3-mercapto 1-propanesulfonate, copper crystal can be made fine and a plating surface having less unevenness can be obtained. In addition to the action of making copper crystal fine, the organic compound has an action of preventing a produced copper foil from being fragile. The organic compound alleviates inner stress accumulated in the copper foil so that the organic compound not only prevents breaking and curling of the copper foil occurring when the copper foil is wound from a cathode drum, but also improves elongations at room temperature and high temperature.

The other organic compound to be used in combination of the present invention is a low molecular weight glue. The low molecular weight glue is a glue or gelatin a molecular weight of which is made small by decomposing a generally produced glue or gelatin with an enzyme, an acid or an alkali. The low molecular weight glue is commercially available as, for example, "PBF" (trade name) produced by Nippi Gelatin Co. in Japan and "PCRA" (trade name) produced by Peter-Cooper Co. in U.S.A. These commercially available products have weight average molecular weights (Mw) of 10,000 or less and are characterized in that jelly strength is extremely low due to the low molecular weights.

Common glue and gelatin have effects of preventing microporosity and controlling roughness of a matte side to improve a shape thereof, but they have a problem of lowering elongation characteristics. However, it has been found that by using a glue having a molecular weight which is smaller than those of commercially available common glue and gelatin, it is possible to obtain effects of preventing microporosity and controlling roughness of a matte side to improve a shape thereof without greatly impairing elongation and other characteristics.

When the high molecular weight polysaccharide and the low molecular weight glue are simultaneously added to 3-mercapto 1-propanesulfonate, elongation at high temperature is further improved and also it is possible to prevent microporosity and obtain a fine and uniform uneven surface as compared with the case of adding the high molecular weight polysaccharide or the low molecular weight glue alone.

An amount of 3-mercapto 1-propanesulfonate to be added to the electrolyte is preferably in the range of 0.05 to 5 ppm by weight, an amount of the high molecular weight polysaccharide of 0.1 to 15 ppm by weight, and an amount of the low molecular weight glue of 0.3 to 35 ppm by weight, respectively.

Further, in addition to the above organic additive, a chloride ion is added to the electrolyte. When no chloride ion exists in the electrolyte, the desired copper foil having a matte side which is low-profiled cannot be obtained. Its amount to be added may be several ppm by which the effects exhibit, but in order to produce a low-profiled copper foil in a broad current density range stably, it is preferred to keep the amount in a range of 10 to 60 ppm. Even when the amount exceeds 60 ppm, low profiling can be effected. However, the effect of low profiling is not increased significantly accompanied with increase in the amount, and when the amount is excessive, dendritic electrodeposition occurs or limiting current density is lowered. As the method of adding the chloride ion, hydrochloric acid or sodium chloride is dissolved in water and the aqueous solution is added to the electrolyte.

As described above, by adding 3-mercapto 1-propanesulfonate in combination of the high molecular weight polysaccharide and/or the low molecular weight glue and a minute amount of the chloride ion to the electrolyte, various characteristics required for a low-profiled copper foil for fine patterning can be realized at a high level.

Further, the surface roughness $R_z$ at the matte side of the untreated copper foil of the present invention is the same or smaller than the surface roughness $R_z$ at the shiny side of said untreated copper foil so that the surface treated copper foil after subjecting to bond enhancing treatment onto the matte side becomes more low-profiled one as compared with the conventional foil whereby it becomes a foil having a large etching factor.

EXAMPLES

In the following, the present invention is described in more detail by referring to Examples, but the present invention is not limited by these Examples.

Examples 1 to 4

(1) Foil preparation

Electrolytes having compositions shown in Table 1 (copper sulfate-sulfuric acid solutions before additives were added) were cleaned by passing them through activated carbon filters. Then, to the electrolytes were added sodium 3-mercapto 1-propanesulfonate, hydroxyethyl cellulose as a high molecular weight polysaccharide, a low molecular weight glue (molecular weight: 3,000) and a chloride ion so as to have concentrations shown in Table 1, respectively, whereby electrolytes for foil preparation were prepared. All of the concentrations of the chloride ion were adjusted to 30 ppm, but the present invention is not limited by this concentration. By using the electrolytes thus prepared and using a noble metal oxide-coated titanium electrode as an anode and a rotating drum made of titanium as a cathode, untreated copper foils each having a thickness of 18 μm were prepared by electroforming preparation under electrolysis conditions shown in Table 1.

(2) Evaluation of matte side roughness and mechanical characteristics

With respect to the untreated copper foils of the respective Examples obtained in (1), surface roughnesses $R_z$ and $R_a$ were measured by using a surface roughness meter (SE-3C model produced by Kosaka Kenkyujo, Japan). Here, the surface roughnesses $R_z$ and $R_a$ are $R_z$ and $R_a$ defined in "Definitions and Designation of Surface Roughness" of JIS B 0601-1994. That is, $R_z$ is a ten-point mean roughness expressed in micrometer (μm) which is the value of difference between the mean value of altitudes of peaks from the highest to the 5th, measured in the direction of vertical magnification from a straight line that is parallel to the mean line and that does not intersect the profile, and the mean value of altitudes of valleys from the deepest to the 5th, within a sampled portion, of which length corresponds to the reference length, from the profile, and $R_a$ is a center-line mean roughness expressed in micrometer (μm) which is the value, when the roughness curve has been expressed by $y=f(x)$, obtained from the following formula, extracting a part of measuring length l in the direction of its center-line from the roughness curve, and taking the centerline of this extracted part as X-axis and the direction of vertical magnification as Y-axis.

$$R_a = \frac{1}{l} \int_0^l |f(x)| dx$$

Incidentally, a reference length: l is 2.5 mm when the matte side is measured and 0.8 mm when the shiny side is measured. Also, elongation after holding the copper foils for 5 minutes in the longitudinal direction at room temperature and a temperature of 180° C. and also tensile strength at the respective temperatures were measured by using a tensile tester (1122 model produced by Instron Co., England), respectively. The results are shown in Table 2.

Comparative Examples 1 and 2

With respective to copper foils prepared in the same manner as in Examples except for carrying out electrolysis by using electrolytes having compositions shown in Table 1 under electrolysis conditions shown in Table 1, matte side roughness and mechanical characteristics were evaluated. The results are shown in Table 2.

TABLE 1

| Examples or Comparative examples | Electrolyte compositions and electrolysis conditions ||||||
|---|---|---|---|---|---|---|---|
| | Additives ||||| Electrolysis conditions ||
| | MPS (ppm) | HEC (ppm) | Glue (ppm) | Thiourea (ppm) | Cl⁻ (ppm) | Current density (A/dm²) | Temperature (°C.) |
| Example 1 | 1.5 | 10.0 | — | — | 30 | 50 | 58 |
| Example 2 | 0.5 | — | 3.0 | — | | | |
| Example 3 | 0.5 | 3.0 | 6.0 | — | | | |
| Example 4 | 1.0 | 5.0 | 5.0 | — | | | |
| Comparative example 1 | — | — | 1.5 | 0.4 | | | |
| Comparative example 2 | — | — | 4.0 | — | | | |

Electrolyte is copper sulfate/sulfuric acid solution and the concentrations are 90 g/l of copper and 110 g/l of sulfuric acid.
MPS: Sodium 3-mercapto 1-propanesulfonate
HEC: Hydroxyethyl cellulose
Glue: The low molecular weight glue (molecular weight Mw: 3,000) was used in Examples 2 to 4 and common glue (molecular weight Mw: 60,000) was used in Comparative examples 1 and 2.

TABLE 2

Surface roughness and mechanical characteristics of untreated copper foil

| | Matte side roughness ($\mu$m) | | Shiny side roughness ($\mu$m) | | Room temperature (25° C.) | | High temperature (180° C.) | |
|---|---|---|---|---|---|---|---|---|
| | $R_z$ | $R_a$ | $R_z$ | $R_a$ | Tensile strength (kgf/mm$^2$) | Elongation (%) | Tensile strength (kgf/mm$^2$) | Elongation (%) |
| Example 1 | 1.3 | 0.30 | 2.0 | 0.40 | 37.2 | 18.1 | 18.6 | 26.7 |
| Example 2 | 2.1 | 0.32 | 2.1 | 0.35 | 33.6 | 11.7 | 19.5 | 19.7 |
| Example 3 | 1.1 | 0.20 | 1.8 | 0.35 | 35.3 | 19.8 | 19.0 | 24.6 |
| Example 4 | 0.6 | 0.14 | 1.4 | 0.23 | 33.8 | 14.4 | 18.7 | 25.8 |
| Comparative example 1 | 3.3 | 0.40 | 2.0 | 0.37 | 36.8 | 9.0 | 20.3 | 8.0 |
| Comparative example 2 | 4.8 | 0.70 | 2.1 | 0.32 | 33.7 | 9.5 | 20.5 | 2.0 |

In Example 1 in which sodium 3-mercapto 1-propanesulfonate and hydroxyethyl cellulose were added and in Example 2 in which sodium 3-mercapto 1-propanesulfonate and the low molecular weight glue were added, matte side roughnesses (surface roughnesses at matte sides) are sufficiently small, and high temperature elongation characteristics are excellent.

In Examples 3 and 4 in which hydroxyethyl cellulose and the low molecular weight glue were added to sodium 3-mercapto 1-propanesulfonate, matte side roughnesses become smaller as compared with those of Examples 1 and 2.

To the contrary, in Comparative example 1 in which thiourea and glue were added, whereas the roughness of the matte side becomes small as compared with the conventional untreated copper foil, it is rougher than the untreated copper foil of the present invention and only an untreated copper foil having a matte side with a larger roughness than that of the shiny side is obtained. Also, in the case of the untreated copper foil, high temperature elongation is small.

In Comparative example 2, characteristics of an electrodeposited copper foil prepared by using common glue are shown for reference as Prior art copper foil example.

Next, bond enhancing treatment was carried out onto the matte sides of the untreated copper foils shown in Examples 1 to 4 and Comparative examples 1 and 2, respectively. Also, the same bond enhancing treatment was carried out onto the shiny side of the untreated copper foil shown in Comparative example 2. Bath composition and conditions for the treatment are as mentioned below. After the bond enhancing treatment, stain proofing was further carried out to the foil to prepare a treated copper foil. The surface roughness of the copper foil was measured by using a surface roughness meter (SE-3C model produced by Kosaka Kenkyujo, Japan). The results are shown in Table 3. In Table 3, Examples 1 to 4 and Comparative examples 1 and 2 each correspond to copper foils in which untreated copper foils of Examples 1 to 4 and Comparative examples 1 and 2 in Table 2 are subjected to bond enhancing treatment onto their matte sides, respectively, and Comparative example 3 in Table 3 is a foil in which the untreated copper foil of Comparative example 2 in Table 2 is subjected to bond enhancing treatment onto its shiny side.

1. Copper plating conditions of First layer

| Bath composition | |
|---|---|
| Metal copper | 20 g/l |
| Sulfuric acid | 100 g/l |
| Bath temperature | 25 °C. |
| Current density | 30 A/dm$^2$ |
| Plating time | 10 seconds |

2. Copper plating conditions of Second layer

| Bath composition | |
|---|---|
| Metal copper | 60 g/l |
| Sulfuric acid | 100 g/l |
| Bath temperature | 60 °C. |
| Current density | 15 A/dm$^2$ |
| Plating time | 10 seconds |

The resulting copper foils are each laminated to one surface of a glass epoxy resin FR-4 (trade name) substrate to prepare copper-clad laminated boards, respectively. Further, evaluation of etching property was carried out by the following "evaluation method".

Evaluation Method

Evaluation of the etching property was carried out by the following method. That is, after washing the surface of each copper-clad laminated board, a liquid resist was uniformly coated with a thickness of 5 $\mu$m on said surface and dried. Next, a circuit pattern for testing was placed on the resist and ultraviolet ray was irradiated with 200 mJ/cm$^2$ by using an exposure machine. The test pattern comprises ten parallel lines with a line width of 100 $\mu$m, a space width of 100 $\mu$m and a length of 5 cm. Immediately after irradiation, development, washing and drying were carried out.

Thus, to the respective copper-clad laminated boards in which a circuit was formed by the resist, etching was carried out by using an etching evaluation device. The etching evaluation device is to inject an etching solution to the vertically standing copper-clad laminated board sample from a right angle direction with a single nozzle. As the etching solution, a solution in which ferric chloride and hydrochloric acid were mixed (FeCl$_3$: 2 mole/l, HCl: 0.5 mole/l) was used. Etching was carried out at a solution temperature of 50° C., an injection pressure of 0.16 MPa, a solution flow amount of 1 l/min and a distance of the sample and the nozzle of 15 cm. An injection time was made 55 seconds. Immediately after injection, washing was carried out and the resist was removed by using acetone to obtain a printed circuit pattern.

To the resulting respective printed circuit patterns, an etching factor at a bottom width of 70 μm was measured. At the same time, peeling strength (peeling resistance) was also measured. The results are shown in Table 3.

TABLE 3

Surface roughness and etching property after bond enhancing treatment

| Examples or Comparative examples | Roughness of bond enhancing treated surface (μm) | | Etching factor | Peeling strength* (kgf/cm) |
|---|---|---|---|---|
| | $R_z$ | $R_a$ | | |
| Example 1 | 1.8 | 0.3 | 3.9 | 1.14 |
| Example 2 | 2.2 | 0.5 | 3.8 | 1.17 |
| Example 3 | 1.6 | 0.3 | 3.9 | 1.16 |
| Example 4 | 1.1 | 0.3 | 4.1 | 1.13 |
| Comparative example 1 | 3.7 | 0.5 | 3.2 | 1.06 |
| Comparative example 2 | 7.3 | 1.1 | 2.3 | 1.64 |
| Comparative example 3 | 4.6 | 0.7 | 3.5 | 1.13 |

*measured by using FR-4 substrate.

When a etching factor value is large, etching characteristics can be judged to be good. As can be seen from Table 3, the etching factors of Examples 1 to 4 are markedly larger than those of Comparative examples 1 to 3.

In Comparative examples 1 and 2, roughnesses of the matte sides of the untreated copper foils are large as compared with those of Examples 1 to 4 so that roughnesses after bond enhancing treatment are large whereby etching factors are not good. Incidentally, the roughness of the matte side of the untreated copper foil of Example 2 and that of the shiny side of the untreated copper foil of Comparative example 3 are substantially the same. However, although these foils are treated under the same conditions, the surface roughness after bond enhancing treatment of Example 2 is smaller than that of Comparative example 3 which is a conventional example. The reason of the above can be considered that, since the shiny side is a surface directly contacted with a titanium drum, a flaw in the drum is transferred as such and when the bond enhancing treatment is carried out thereon, roughened copper grains become likely rough and large and finally the surface roughness after the bond enhancing treatment becomes large. On the other hand, the matte side of the copper foil according to the present invention is extremely dense due to mirror surface-state electrodeposition, and when a bond enhancing treatment is carried out thereon, roughened copper grains become finer and the surface roughness after the bond enhancing treatment becomes finally smaller. This is more remarkable in Examples 1, 3 and 4 where each of the surface roughness of a matte side of the untreated copper foil is further small, whereby their roughnesses of the surfaces subjected to bond enhancing treatment become extremely small and etching factors thereof are large. The reason why the peeling strengths of Examples 1 to 4 are substantially the same as that of Comparative example 3 irrespective of having extremely small roughness of the treated surface can be considered that roughened copper grains become finer by the bond enhancing treatment so that the surface area becomes large whereby peeling strength becomes large in spite of small roughness.

Although the value of the etching factor of Comparative example 3 shows a value closer to that of Examples 1 to 4, it is inferior to Examples 1 to 4 in terms of the traces left behind at the time of etching because the roughness of the roughening treatment is larger in Comparative example 3 than it is in the case of Examples 1 to 4.

As described above, according to the present invention, low profiling of an electrodeposited copper foil can be realized easily, and also an electrodeposited copper foil having excellent elongations at room temperature and high temperature and also high tensile strength can be obtained. The electrodeposited copper foil thus obtained can be used suitably as an inner or outer layer copper foil for a high density printed-wiring board and further as an electrodeposited copper foil for a flexible substrate because of improvement in flexibility.

Further, as compared with a conventional untreated copper foil, both surfaces of the untreated copper foil obtained by the present invention are flat, whereby the foil obtained by the present invention can be used as an electrode for a secondary battery, a flat cable, a material for electric cable-covering and shielding material or the like.

We claim:

1. An electroplated copper foil formed by electrodeposition of copper onto a drum and which comprises a copper foil having a shiny side formed in contact with the drum and a matte side wherein, without surface treatment, said matte side has a surface roughness Rz measured by JIS B 0601-1994 substantially the same as or less than that of the shiny side formed as a result of the electrodeposition of the copper foil using an electrolyte containing 0.05 to 5 ppm by weight 3-mercapto 1-propanesulfonate; at least one organic compound selected from the group consisting of 0.1 to 15 ppm by weight of a polysaccharide which is a carbohydrate selected from the group consisting of starches, celluloses and vegetable rubbers, and 0.3 to 35 ppm by weight of a low molecular weight glue having a weight average molecular weight of 10,000 or less; and 10 to 60 ppm of a chloride ion.

2. The foil according to claim 1, wherein the 3-mercapto 1-propanesulfonate is sodium 3-mercapto 1-propanesulfonate.

3. The foil according to claim 1, wherein the organic compound is the polysaccharide.

4. The foil according to claim 1, wherein the organic compound is the low molecular weight glue having the weight average molecular weight of 10,000 or less.

5. The foil according to claim 1, wherein the organic compound is a mixture of the polysaccharide and the low molecular weight glue having a weight average molecular weight of 10,000 or less.

6. The foil according to claim 1, wherein the foil is subjected to a surface bond enhancing treatment.

7. The foil according to claim 6, wherein the surface bond enhancing treatment is carried out by electrodeposition.

8. A copper-clad laminated board comprising an electrodeposited copper foil according to claim 1.

9. A printed circuit board comprising an electrodeposited copper foil according to claim 1.

10. A secondary battery cell including a component comprising an electrodeposited copper foil according to claim 1.

11. An improved method for electrolytically producing a copper foil formed by electrodeposition of copper onto a drum, the copper foil having a shiny side formed in contact with the drum and a matte side, the improvement wherein the method produces a copper foil wherein, without treatment, the matte side has a surface roughness Rz measured by JIS B 0601-1994 substantially the same as or less than that of the shiny side, said method comprising carrying out electrolysis with an electrolyte comprising 0.05 to 5 ppm by weight 3-mercapto 1-propanesulfonate; at least one organic compound selected from the group consisting of 0.1 to 15 ppm by weight of a polysaccharide which is a carbohydrate selected from the group consisting of starches, celluloses and vegetable rubbers, and 0.3 to 35 ppm by weight of a low molecular weight glue having a weight average molecular weight of 10,000 or less; and 10 to 60 ppm of a chloride ion.

12. The method according to claim 11, wherein the 3-mercapto 1-propanesulfonate is sodium 3-mercapto 1-propanesulfonate.

13. The method according to claim 11, wherein the organic compound is the polysaccharide.

14. The method according to claim 11, wherein the organic compound is the low molecular weight glue having the weight average molecular weight of 10,000 or less.

15. The method according to claim 11, wherein the organic compound is a mixture of the polysaccharide and the low molecular weight glue having a weight average molecular weight of 10,000 or less.

* * * * *